(12) United States Patent
Pratt et al.

(10) Patent No.: US 11,169,110 B2
(45) Date of Patent: Nov. 9, 2021

(54) METHOD OF DEPOSITING ELECTRODES AND ELECTROLYTE ON MICROELECTROMECHANICAL SYSTEM ELECTROCHEMICAL SENSORS

(71) Applicant: HONEYWELL INTERNATIONAL INC., Morris Plains, NJ (US)

(72) Inventors: Keith Francis Edwin Pratt, Morris Plains, NJ (US); Cristian Vasile Diaconu, Morris Plains, NJ (US); Yong-Fa Wang, Morris Plains, NJ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 223 days.

(21) Appl. No.: 16/174,577

(22) Filed: Oct. 30, 2018

(65) Prior Publication Data

US 2019/0128835 A1 May 2, 2019

(30) Foreign Application Priority Data

Oct. 31, 2017 (EP) .................................... 17199488

(51) Int. Cl.
*G01N 27/407* (2006.01)
*B81B 7/00* (2006.01)
*B81C 1/00* (2006.01)

(52) U.S. Cl.
CPC ....... *G01N 27/4073* (2013.01); *B81B 7/0006* (2013.01); *B81C 1/0046* (2013.01); *B81C 1/00166* (2013.01); *G01N 27/4076* (2013.01); *B81B 2201/0214* (2013.01); *B81B 2203/04* (2013.01); *B81C 2201/0153* (2013.01); *B81C 2201/0154* (2013.01); *B81C 2201/0187* (2013.01)

(58) Field of Classification Search
None
See application file for complete search history.

(56) References Cited

U.S. PATENT DOCUMENTS

| 4,820,386 A | 4/1989 | LaConti et al. |
| 7,332,377 B2 | 2/2008 | Happ et al. |
| (Continued) | | |

FOREIGN PATENT DOCUMENTS

| CN | 104049019 A | 9/2014 |
| CN | 106415912 A | 2/2017 |
| DE | 102009002118 A1 | 10/2010 |

OTHER PUBLICATIONS

Decision to grant a European patent dated Jan. 16, 2020 for EP Application No. 17199488.
(Continued)

*Primary Examiner* — J. Christopher Ball
(74) *Attorney, Agent, or Firm* — Alston & Bird LLP (57) ABSTRACT

Embodiments relate generally to systems, devices, and methods for depositing an electrode and an electrolyte on a microelectromechanical system (MEMS) electrochemical sensor. A method may comprise providing a blade on a surface of a substrate; providing a ridge along the perimeter of the substrate; pressing the electrode and the electrolyte onto the blade and the ridge; cutting the electrode into multiple electrodes; positioning the electrolyte to contact the surface, the blade, and the ridge; and positioning the multiple electrodes to contact the surface, the blade, and the ridge.

12 Claims, 5 Drawing Sheets

(56) References Cited

U.S. PATENT DOCUMENTS

| | | |
|---|---|---|
| 8,702,962 B1 | 4/2014 | Hunter et al. |
| 8,821,968 B2 | 9/2014 | Jiang et al. |
| 2012/0192413 A1* | 8/2012 | Ma .................... H01L 23/49822 29/825 |
| 2016/0214107 A1* | 7/2016 | Viasnoff ................. G02B 21/04 |

OTHER PUBLICATIONS

Extended European Search Report for Application No. 17199488.2, dated Mar. 8, 2018, 8 pages.
Office Action for Chinese Patent Application No. 201811285851.X dated Sep. 1, 2020, 7 pages.

* cited by examiner

METHOD OF DEPOSITING ELECTRODES AND ELECTROLYTE ON MICROELECTROMECHANICAL SYSTEM ELECTROCHEMICAL SENSORS

CROSS-REFERENCE TO RELATED APPLICATIONS

This application claims the benefit of European Patent Application No. 17199488.2 filed Oct. 31, 2017, the disclosure of which is herein incorporated by reference in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Electrochemical sensors may be utilized to detect various types of gases including oxygen, as well as other types of gases, such as, for example, hydrogen sulfide, chlorine, nitric oxide, carbon monoxide, and hydrocarbons. Electrochemical sensors may be positioned within a housing which may include an electrolyte. External electrical connections may allow the electrochemical sensors to be electrically coupled to external processing circuitry. Typically, the electrochemical sensor assembly including the housing and the electrochemical sensors is relatively large. The overall size may contribute to signal degradation between the electrochemical sensors and the external processing circuitry, and may also preclude use in small instruments, such as, for example, mobile phones, wearables, etc. Additionally, large size electrodes and large size electrolyte volume may increase the cost of the sensor.

SUMMARY

In an embodiment, a method for depositing an electrode and an electrolyte on a microelectromechanical system ("MEMS") electrochemical sensor, the method comprising: providing a blade on a surface of a substrate; providing a ridge along the perimeter of the substrate, wherein the height of the ridge is greater than the height of the blade, wherein the ridge is positioned to surround the blade, wherein pockets are positioned along the surface between the blade and the ridge, wherein the ridge is tapered; pressing the electrode and the electrolyte onto the blade and the ridge, wherein the electrolyte is positioned to contact the top of the electrode; cutting the electrode into multiple electrodes; positioning the electrolyte within the pockets to contact the surface, the blade, and the ridge; and positioning the multiple electrodes within the pockets to contact the surface, the blade, and the ridge.

In an embodiment, a MEMS electrochemical sensor may comprise a substrate comprising a surface; a blade configured to cut an electrode into separate electrodes; a ridge extending along the perimeter of the substrate, wherein the height of the ridge is greater than the height of the blade, wherein the ridge is positioned to surround the blade, wherein pockets are positioned along the surface between the blade and the ridge, wherein the ridge is tapered and configured to cut an electrolyte.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example;

The terms "about" or "approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

MEMS semiconductor manufacturing techniques enable very small, low cost sensors to be fabricated. However, the gas diffusion electrodes traditionally used for electrochemical gas sensors are difficult to pattern at the sort of scales needed for a small MEMS device (e.g., 100 μm and less). Although other types of electrode and manufacturing techniques can be used, there are benefits to being able to use conventional gas diffusion electrodes.

Systems, methods, and devices of the disclosure may allow a conventional stack of electrodes and a solid electrolyte to be deposited onto a MEMS substrate, without needing a separate means of patterning or cutting the electrode/electrolyte stack. This greatly simplifies manufacturing and reduces costs. Compared to conventional deposition techniques such as thick film printing, systems, methods, and devices of the disclosure allow the electrode/electrolyte stack to be prepared as an un-patterned sheet which is deposited directly onto the silicon tile or wafer in a single step. The solid polymer electrolyte is precast as a large sheet with a gas diffusion electrode deposited on one side. This may be achieved by either pre-fabricating the electrode and electrolyte and pressing them together, or by casting the electrolyte directly onto the electrode, or by printing the electrode directly onto the pre-cast electrolyte. The silicon devices have raised cutting features (e.g., a ridge and a blade), which cut through the electrode but not completely through the electrolyte when the parts are pressed together. This separates out the gas diffusion electrode into separate regions which then make contact to suitable connections underneath each electrode region on the surface of the substrate, to create electrodes such as the sensing, counter, and reference electrodes. Optionally, taller features around the perimeter of each device cut right through the electrolyte layer, thereby punching out the electrolyte for each device. The electrolyte can be deposited onto individual diced substrates, or preferably deposited onto a whole wafer in a single step. The cutting features may be produced by etching the substrate or may be a separate component such as a glass or separate silicon structure bonded to the flat substrate.

Figure 1:
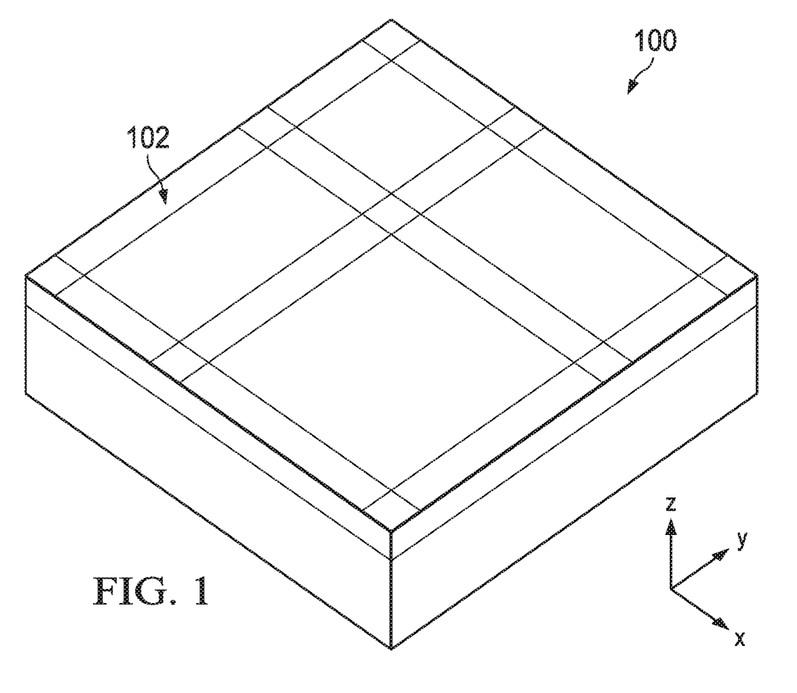
FIG. 1 illustrates a silicon substrate in accordance with embodiments of the disclosure.

FIG. 1 is a schematic illustration of a silicon substrate 100 with a top surface 102. Substrate 100 may be of any suitable shape, such as, for example, a rectangular prism (as shown), cube, etc.

Figure 2:
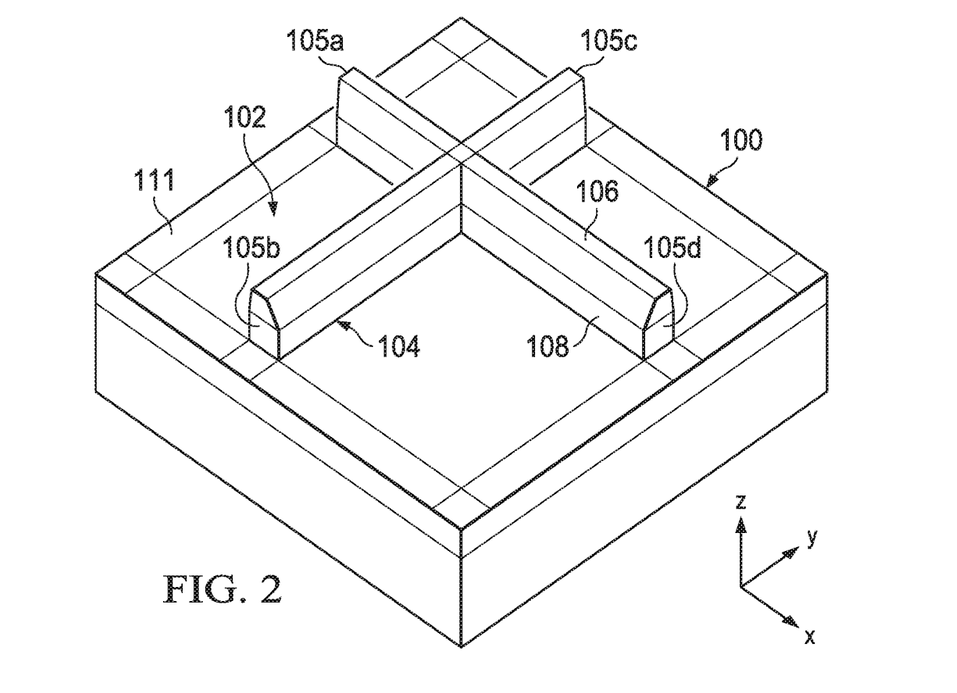
FIG. 2 illustrates a silicon substrate with a blade in accordance with embodiments of the disclosure.

FIG. 2 is a schematic illustration of a blade 104 comprising silicon dioxide ($SiO_2$). Blade 104 may extend outward from top surface 102. In some embodiments, blade 104 may be a glass or separate silicon structure, wherein proximal end 108 of blade 104 may be bonded (e.g., adhesive, welds) to top surface 102. In other embodiments, blade 104 may be produced/formed by etching substrate 100. Blade 104 may be tapered from proximal end 108 to distal end 106. The tapering provides blade 104 with a sharp edge to cut through an electrode (e.g., electrode 126 shown on FIG. 5) and an electrolyte (e.g., electrolyte 124 shown on FIG. 5). In certain embodiments, blade 104 may resemble a cross with each end (four ends: end 105 a, end 105 b, end 105 c, end 105 d) of the cross contacting perimeter 111, as shown. Blade 104 may extend along top surface 102 to perimeter 111.

Figure 3:
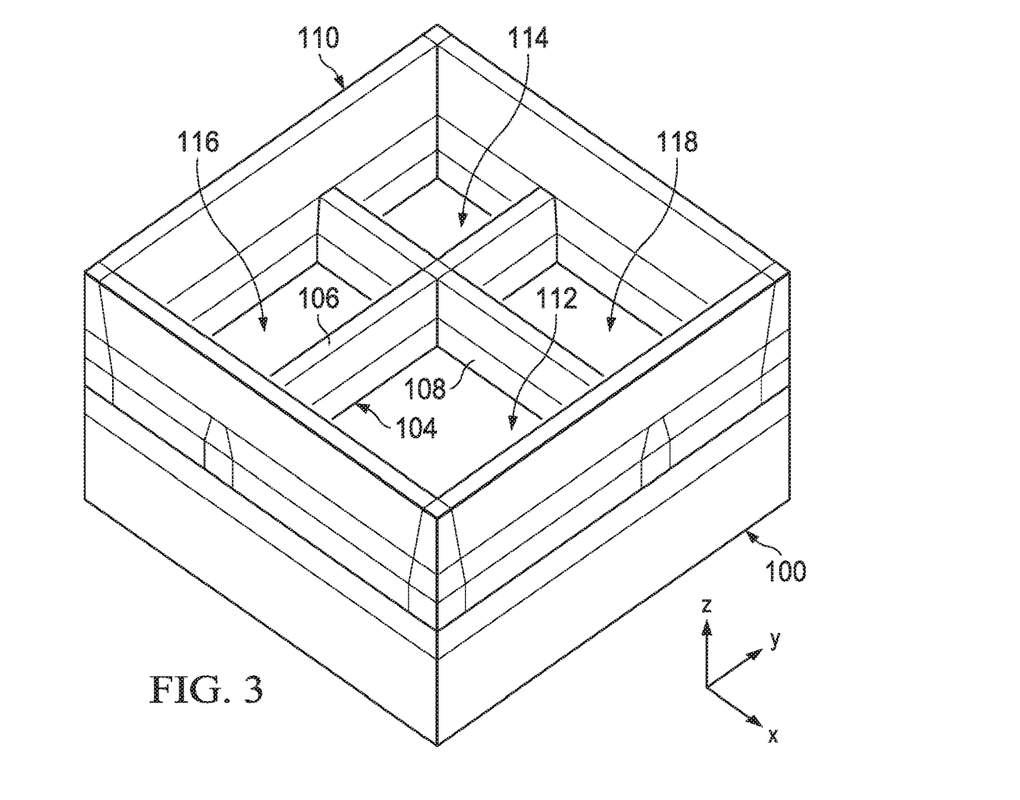
FIG. 3 illustrates a silicon substrate with a blade and a ridge in accordance with embodiments of the disclosure.

FIG. 3 illustrates ridge 110 extending along perimeter 111 (shown on FIG. 2) of top surface 102. Ridge 110 may comprise $SiO_2$. Ridge 110 may extend above blade 104 (e.g., extend away from top surface 102), as shown. That is, the height of ridge 110 may be greater than the height of blade 104. Ridge 110 may be a glass or separate silicon structure bonded against perimeter 111 of top surface 102 (e.g., as shown on FIG. 4, proximal end 120 of ridge 110 may be bonded to perimeter 111). In other embodiments, ridge 110 may be produced by etching substrate 100. Ridge 110 may comprise $SiO_2$. The height of ridge 110 may be the same as the thickness of the electrolyte (e.g., electrolyte 124 shown on FIG. 5) combined with the electrode (e.g., electrode 126 shown on FIG. 5). That is, the top surface of the electrolyte (e.g., electrolyte 124 shown on FIG. 5) will be flush (i.e., a continuous plane) with ridge 110 when the electrolyte and the electrode (e.g., electrode 126 shown on FIG. 5) are pressed as a stack onto ridge 110 and blade 104. In some embodiments, the height of ridge 110 may be slightly taller than the combined thickness of the electrolyte with the electrode (e.g., if the electrolyte is supported by a slightly compressible material). As noted above, the solid polymer electrolyte (e.g., electrolyte 124 shown on FIG. 5) may be pre-cast as a large sheet with a gas diffusion electrode (e.g., electrode 126 shown on FIG. 5) deposited on one side. This may be achieved by either pre-fabricating the electrode and the electrolyte, and pressing them together, or by casting the electrolyte directly onto the electrode, or by printing the electrode directly onto the pre-cast electrolyte. Pockets 112, 114, 116, and 118 may be located along surface 102 between blade 104 and ridge 110. Ridge 110 may be configured to cut the electrolyte and the electrode as the electrolyte and the electrode are pressed upon ridge 110 and blade 104. As the electrode and the electrolyte are pressed onto ridge 110 and blade 104, the cut portions of the electrode and electrolyte may slide against blade 104 and ridge 110 and into pockets 112, 114, 116, and 118, thereby contacting top surface 102, blade 104, and ridge 110. That is, the electrolyte and electrode may be fitted/positioned (e.g., via pressing) within pockets 112, 114, 116, and 118.

Figure 4:
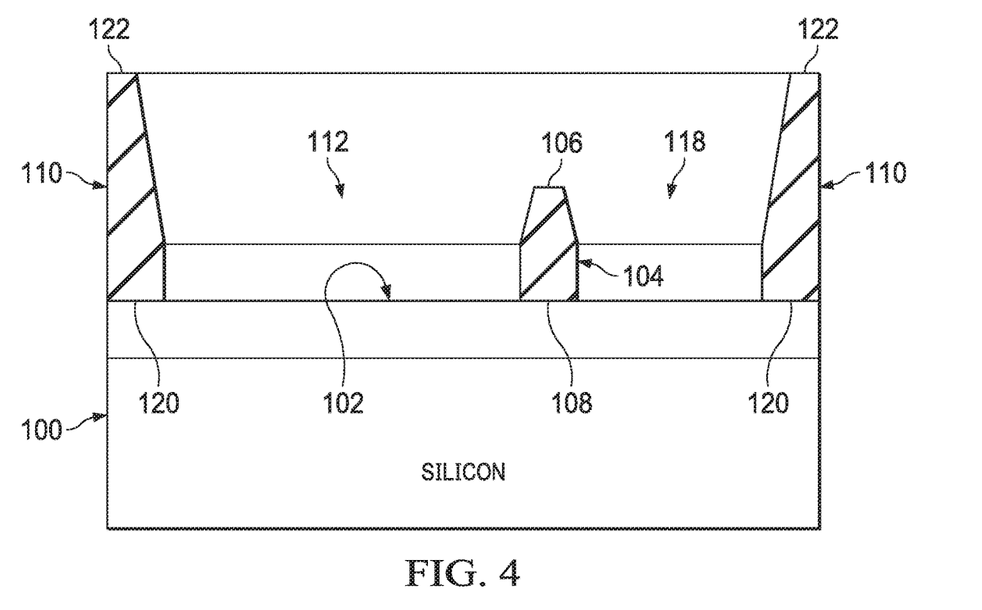
FIG. 4 illustrates a cross section of FIG. 3 in accordance with embodiments of the disclosure.
Figure 5:
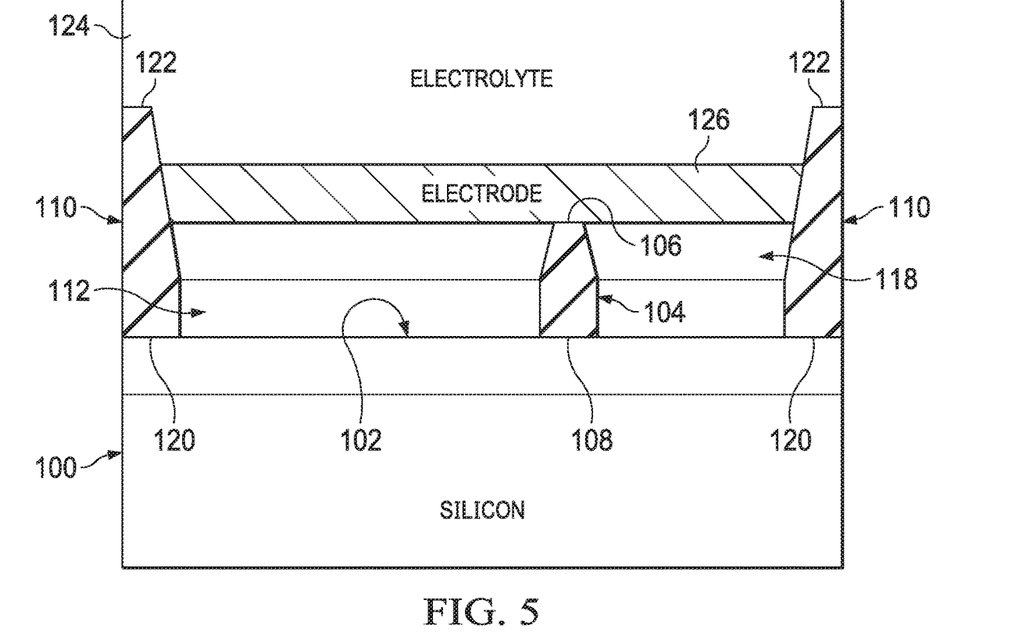
FIG. 5 illustrates a cross section of FIG. 3 and additionally shows an electrolyte and an electrode in accordance with embodiments of the disclosure.

As shown on FIG. 4 (a cross section of FIG. 3), ridge 110 may be tapered from proximal end 120 to distal end 122 to provide a sharp edge for cutting through the electrode (e.g., electrode 126 shown on FIG. 5) and the electrolyte (e.g., electrolyte 124 shown on FIG. 5).

FIG. 5 (cross section of FIG. 3 and additionally shows electrolyte 124 and electrode 126) illustrates electrolyte 124 positioned above electrode 126, thereby forming a stack, wherein electrolyte 124 is in contact with electrode 126, as described above. Electrolyte 124 and electrode 126 may be pressed upon blade 104 and ridge 110. As shown, ridge 110 and blade 104 may cut electrode 126 and electrolyte 124 as electrode 126 and electrolyte 124 are pressed onto blade 104 and ridge 110 and into pockets 112, 114 (shown on FIG. 3), 116 (shown on FIG. 3), and 118.

Figure 6:
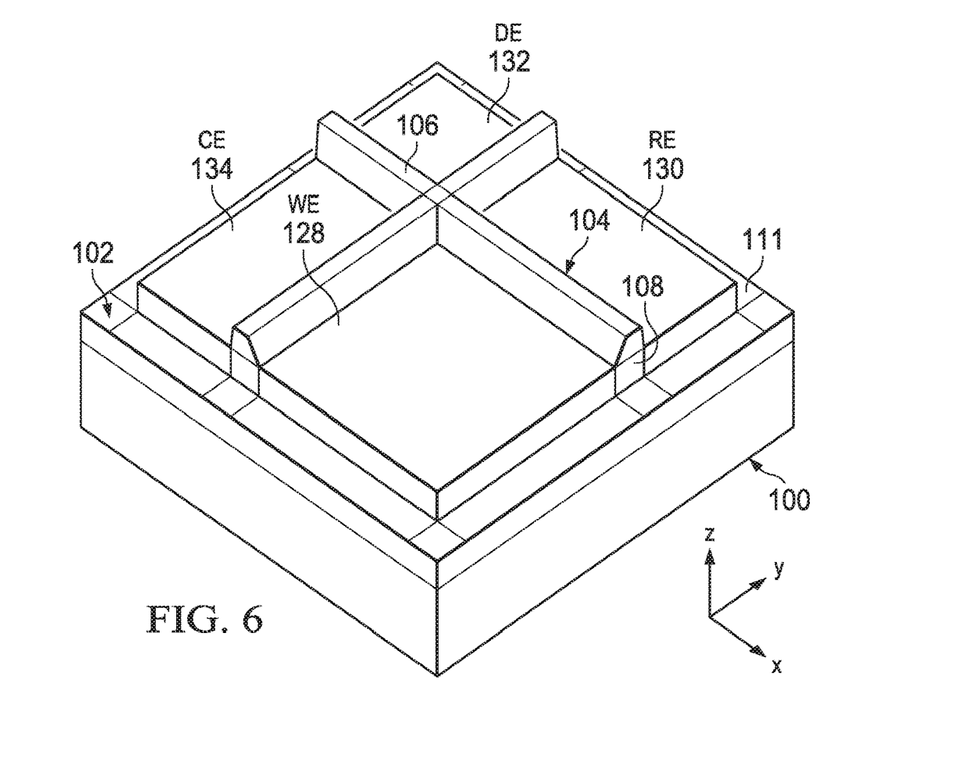
FIG. 6 illustrates multiple electrodes positioned on a substrate in accordance with embodiments of the disclosure.

As shown on FIG. 6, electrode 126, due to the pressing/cutting, as described above, may be cut into multiple electrodes: for example, working electrode 128 (WE), reference electrode 130 (RE), diagnostic electrode 132 (DE), and counter electrode 134 (CE). As shown, electrode 126 has been completely cut into separate electrodes due to the pressing of it against blade 104 and ridge 110. Ridge 110 is not shown on FIG. 6 in order to provide a clear view of working electrode 128, reference electrode 130, diagnostic electrode 132, and counter electrode 134. However, as shown on FIG. 3, ridge 110 extends along perimeter 111.

Figure 7:
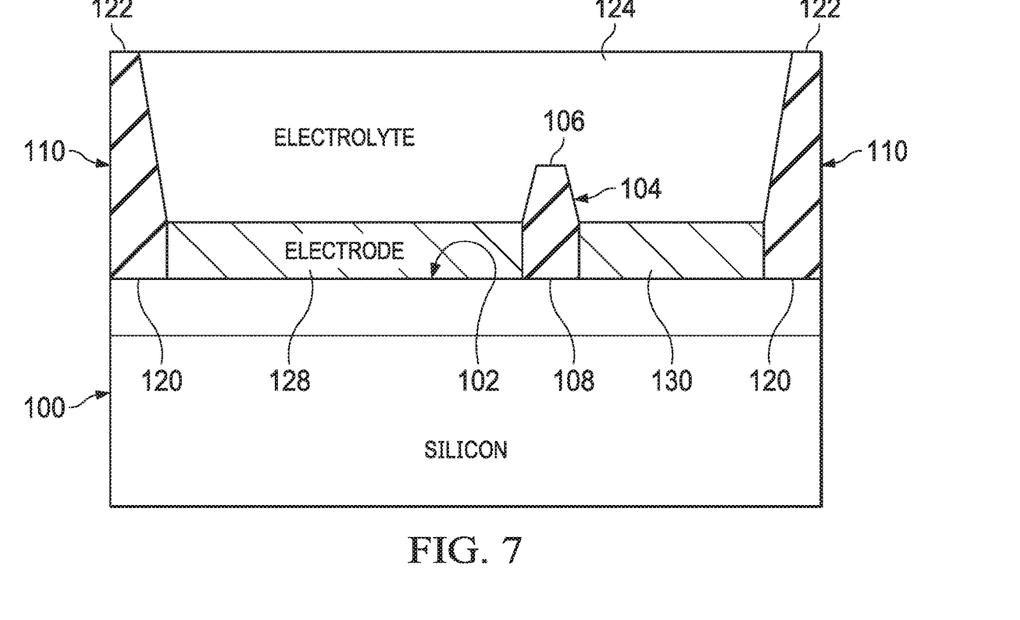
FIG. 7 illustrates a cross section of FIG. 3 and additionally shows an electrolyte and electrode in accordance with embodiments of the disclosure.

FIG. 7 (cross section of FIG. 3 and additionally shows electrolyte 124, working electrode 128 and reference electrode 130 (i.e. electrode 126 after it is cut)) illustrates electrolyte 124, working electrode 128 and reference electrode 130 positioned on substrate 100 (e.g., within pockets 112 and 118, as shown on FIGS. 3 and 5) after the pressing/cutting, as described above. As shown, blade 104 may partially cut into electrolyte 124 and may completely cut electrode 126 (shown in FIG. 5) into separate electrodes (e.g. working electrode 128 and reference electrode 130), as discussed above.

Figure 8:
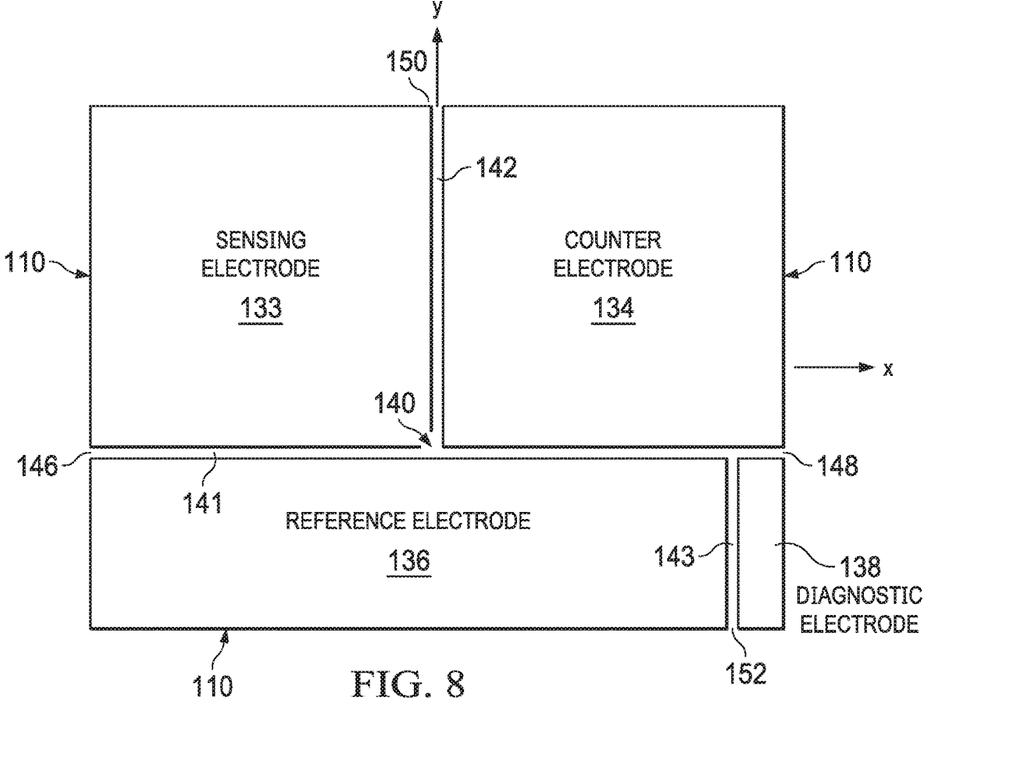
FIG. 8 illustrates a top view of an alternative configuration of a blade, a sensing electrode, a counter electrode, a reference electrode, and an optional diagnostic electrode surrounded by a ridge in accordance with embodiments of the disclosure.

FIG. 8 illustrates a top view of an alternative configuration of a blade (e.g., blade 140), a sensing electrode 133, a counter electrode 134, a reference electrode 136, and an optional diagnostic electrode 138 surrounded by ridge 110 (as described above). Blade 140 may include portion 141, portion 142, and portion 143. Portion 141 may extend along a horizontal axis (x) of the top surface 102 of substrate 100 (shown on FIG. 1), thereby contacting ridge 110 at two points (e.g., point 146 and point 148). Point 146 and point 148 may be on opposite sides of substrate 100 (shown on FIG. 1). Portions 142 and 143 may extend perpendicularly from the horizontal axis (x) and along a vertical axis (y), as shown. Portion 142 may contact ridge 110 at one point (e.g., point 150). Portion 143 may contact ridge 110 at one point (e.g., point 152). Point 150 and point 152 may be on opposite sides of substrate 100 (shown on FIG. 1). The blade, ridge, electrodes and/or electrolyte may be deposited onto a substrate as described above.

Figure 9:
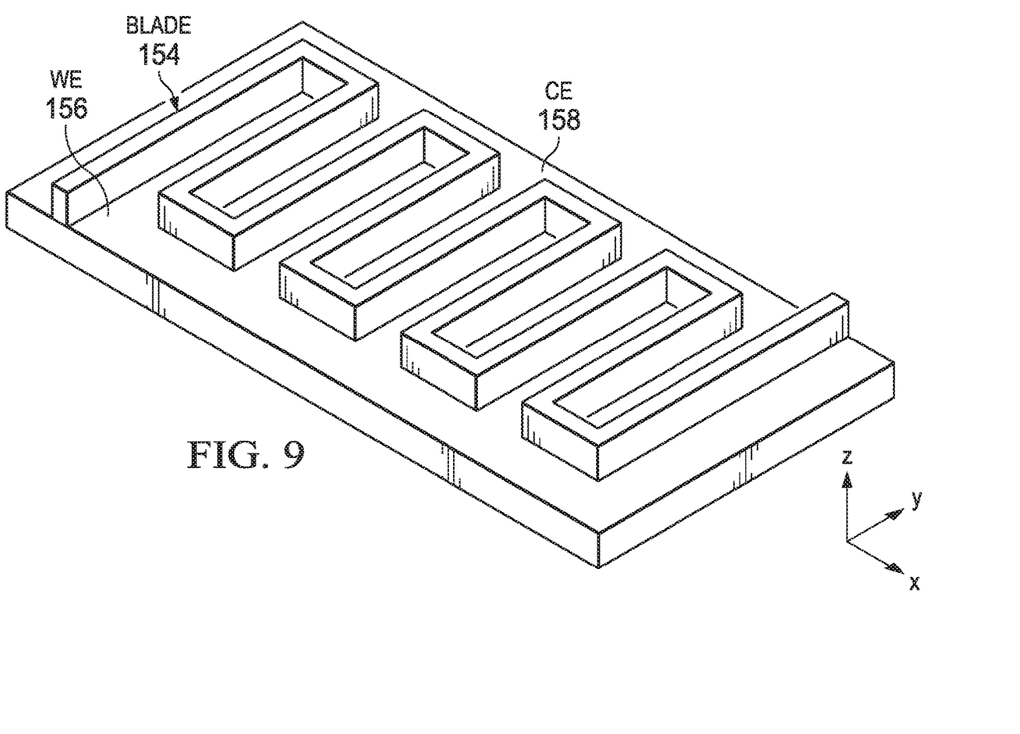
FIG. 9 illustrates an alternative configuration of a blade, a sensing electrode, and a counter electrode in accordance with embodiments of the disclosure.

FIG. 9 illustrates an alternative configuration of a blade (e.g., blade 154), sensing electrode 156, and counter electrode 158. Blade 154, sensing electrode 156, and counter electrode 158 may each be of a zig zag shape. As shown, a single electrode was pressed/cut (as described above) onto blade 154 and a ridge (e.g., ridge 110, shown on FIG. 3) thereby creating separate electrodes. This zig zag configuration of blade 154, sensing electrode 156, and counter electrode 158 may allow a lower impedance between the electrodes when compared to a blade and electrodes that are not in this zig zag configuration. The blade, ridge, electrodes and/or electrolyte may be deposited onto a substrate as described above.

Figure 10:
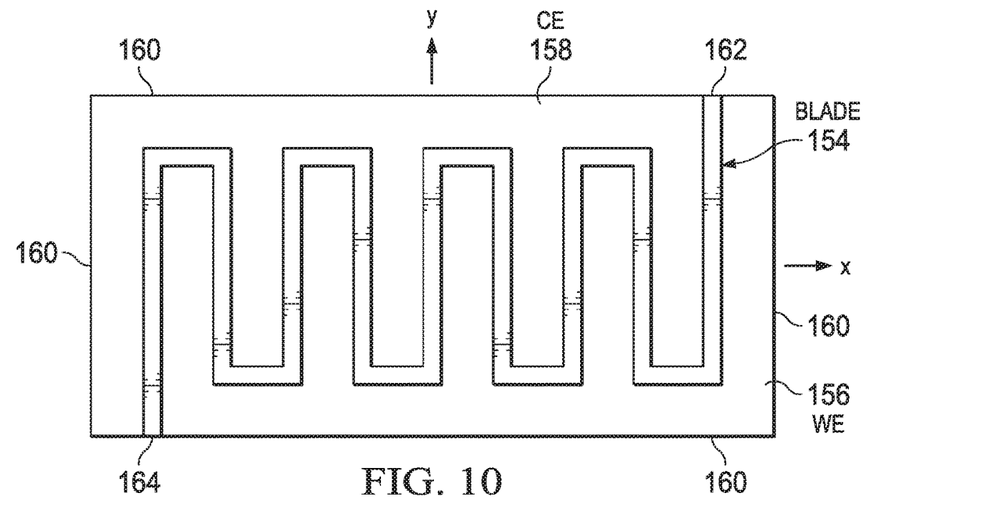
FIG. 10 illustrates a top view of the configuration shown in FIG. 9 in accordance with embodiments of the disclosure.

FIG. 10 illustrates a top view of the configuration shown in FIG. 9. As shown, ridge 160 (e.g., similar to ridge 110 described above) may completely surround blade 154, sensing electrode 156, and counter electrode 158. Blade 154 may contact ridge 160 at points (e.g., points 162, 164) that may be on opposite sides of the substrate (e.g., substrate 100, shown on FIG. 1).

Having described various systems and methods, various embodiments can include, but are not limited to:

In a first embodiment, a method for depositing an electrode and an electrolyte on a MEMS electrochemical sensor, the method comprising: providing a blade on a surface of a substrate; providing a ridge along the perimeter of the substrate, wherein the height of the ridge is greater than the height of the blade, wherein the ridge is positioned to surround the blade, wherein pockets are positioned along the surface between the blade and the ridge, wherein the ridge is tapered; pressing the electrode and the electrolyte onto the blade and the ridge, wherein the electrolyte is positioned to contact the top of the electrode; cutting the electrode into multiple electrodes; positioning the electrolyte within the pockets to contact the surface, the blade, and the ridge; and positioning the multiple electrodes within the pockets to contact the surface, the blade, and the ridge.

A second embodiment may include the method of the first embodiment, further comprising partially cutting the electrolyte with the blade.

A third embodiment may include the method of the first or second embodiments, wherein cutting the electrode comprises completely cutting the electrode into multiple electrodes.

A fourth embodiment may include the method of any one of the preceding embodiments, wherein cutting the electrode comprises cutting the electrode with the blade.

A fifth embodiment may include the method of any one of the preceding embodiments, wherein cutting the electrolyte comprises cutting the electrolyte with the ridge.

A sixth embodiment may include the method of any one of the preceding embodiments, wherein positioning the multiple electrodes comprises sliding the multiple electrodes against the blade and the ridge into the pockets.

A seventh embodiment may include the method of any one of the preceding embodiments, wherein providing the blade comprises etching the substrate to form the blade.

An eighth embodiment may include the method of any one of the preceding embodiments, wherein providing the blade comprises bonding a glass or separate silicon structure to the surface.

A ninth embodiment may include the method of any one of the preceding embodiments, wherein providing the ridge comprises etching the substrate to form the ridge.

A tenth embodiment may include the method of any one of the preceding embodiments, wherein providing the ridge comprises bonding a glass or separate silicon structure to the surface.

In an eleventh embodiment, a MEMS electrochemical sensor may comprise a substrate comprising a surface; a blade configured to cut an electrode into separate electrodes; a ridge extending along the perimeter of the substrate, wherein the height of the ridge is greater than the height of the blade, wherein the ridge is positioned to surround the blade, wherein pockets are positioned along the surface between the blade and the ridge, wherein the ridge is tapered and configured to cut an electrolyte.

A twelfth embodiment may include the MEMS electrochemical sensor of the eleventh embodiment, further comprising a sensing electrode, a counter electrode, and a reference electrode.

A thirteenth embodiment may include the MEMS electrochemical sensor of the eleventh or twelfth embodiments, wherein each of the sensing electrode, the counter electrode, and the reference electrode is positioned within a pocket.

A fourteenth embodiment may include the MEMS electrochemical sensor of any one of the eleventh through thirteenth embodiments, further comprising a diagnostic electrode positioned in a pocket.

A fifteenth embodiment may include the MEMS electrochemical sensor of any one of the eleventh through fourteenth embodiments, further comprising a sensing electrode and a counter electrode, wherein the sensing electrode, the counter electrode, and the blade each include a zig zag shape, wherein the zig zag shape is configured to lower impedance between the sensing electrode and the counter electrode.

In a sixteenth embodiment, a method for depositing an electrode and an electrolyte on a microelectromechanical system (MEMS) electrochemical sensor, the method comprising: providing a ridge along the perimeter of a surface of a substrate; pressing the electrode and the electrolyte onto the ridge, wherein the electrolyte is positioned to contact the top of the electrode; and cutting the electrode into multiple electrodes.

A seventeenth embodiment may the method of the sixteenth embodiment, further comprising providing a blade on the surface of the substrate, wherein the height of the ridge is greater than the height of the blade, wherein the ridge is positioned to surround the blade, wherein pockets are positioned along the surface between the blade and the ridge, wherein the ridge is tapered and configured to cut the electrolyte.

In an eighteenth embodiment, a method for depositing an electrode and an electrolyte on a microelectromechanical system (MEMS) electrochemical sensor, the method comprising: providing a blade on a surface of a substrate; pressing the electrode and the electrolyte onto the blade, wherein the electrolyte is positioned to contact the top of the electrode; and cutting the electrode into multiple electrodes.

A nineteenth embodiment may include the method of the eighteenth embodiment, further comprising providing a ridge along the perimeter of the surface of the substrate, wherein the height of the ridge is greater than the height of the blade, wherein the ridge is positioned to surround the blade, wherein pockets are positioned along the surface between the blade and the ridge, wherein the ridge is tapered and configured to cut the electrolyte.

In a twentieth embodiment, a microelectromechanical system (MEMS) electrochemical sensor comprises a substrate comprising a surface; and a blade configured to cut an electrode into separate electrodes.

A twenty-first embodiment, may include the MEMS electrochemical sensor of the twentieth embodiment, further comprising a ridge extending along the perimeter of the surface of the substrate, wherein the height of the ridge is greater than the height of the blade, wherein the ridge is positioned to surround the blade, wherein pockets are positioned along the surface between the blade and the ridge, wherein the ridge is tapered and configured to cut an electrolyte.

In a twenty-second embodiment, a microelectromechanical system (MEMS) electrochemical sensor comprises a substrate comprising a surface; a ridge extending along the perimeter of the surface of the substrate, wherein the ridge is tapered and configured to cut an electrolyte.

A twenty-third embodiment may include the MEMS electrochemical sensor of the twenty-second embodiment, further comprising a blade configured to cut an electrode into separate electrodes, wherein the height of the ridge is greater than the height of the blade, wherein the ridge is positioned to surround the blade, wherein pockets are positioned along the surface between the blade and the ridge.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification and the claims are embodiment(s) of the present invention(s).

Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as "comprises," "includes," and "having" should be understood to provide support for narrower terms such as "consisting of," "consisting essentially of," and "comprised substantially of" Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method for depositing an electrode and an electrolyte on a microelectromechanical system (MEMS) electrochemical sensor, the method comprising:

providing a ridge along a perimeter of a surface of a substrate;
pressing the electrode and the electrolyte onto the ridge, wherein the electrolyte is positioned to contact the top of the electrode;
cutting the electrode into multiple electrodes; and
providing a blade on the surface of the substrate, wherein a height of the ridge is greater than a height of the blade, wherein the ridge is positioned to surround the blade, wherein pockets are positioned along the surface between the blade and the ridge, and wherein the ridge is tapered and configured to cut the electrolyte.

2. The method of claim 1, further comprising:
pressing the electrode and the electrolyte onto the blade;
partially cutting the electrolyte with the blade; and positioning the multiple electrodes within the pockets to contact the surface, the blade, and the ridge.

3. The method of claim 2, positioning the electrolyte within the pockets to contact the surface, the blade, and the ridge.

4. A method for depositing an electrode and an electrolyte on a microelectromechanical system (MEMS) electrochemical sensor, the method comprising:
providing a blade on a surface of a substrate;
pressing the electrode and the electrolyte onto the blade, wherein the electrolyte is positioned to contact the top of the electrode; and
cutting the electrode into multiple electrodes.

5. The method of claim 4, further comprising providing a ridge along the perimeter of the surface of the substrate, wherein the height of the ridge is greater than the height of the blade, wherein the ridge is positioned to surround the blade, wherein pockets are positioned along the surface between the blade and the ridge, wherein the ridge is tapered and configured to cut the electrolyte.

6. The method of claim 5, further comprising:
pressing the electrode and the electrolyte onto the ridge;
partially cutting the electrolyte with the blade; and
positioning the multiple electrodes within the pockets to contact the surface, the blade and the ridge.

7. A microelectromechanical system (MEMS) electrochemical sensor comprising:
a substrate comprising a surface;
a blade configured to cut an electrode into separate electrodes; and
a ridge extending along the perimeter of the surface of the substrate, wherein the height of the ridge is greater than the height of the blade, wherein the ridge is positioned to surround the blade, wherein pockets are positioned along the surface between the blade and the ridge, wherein the ridge is tapered and configured to cut an electrolyte.

8. The MEMS electrochemical sensor of claim 7, further comprising a sensing electrode, a counter electrode and a reference electrode.

9. A microelectromechanical system (MEMS) electrochemical sensor comprising:
a substrate comprising a surface;
a ridge extending along the perimeter of the surface of the substrate, wherein the ridge is tapered and configured to cut an electrolyte; and
a blade configured to cut an electrode into separate electrodes, wherein the height of the ridge is greater than the height of the blade, wherein the ridge is positioned to surround the blade, wherein pockets are positioned along the surface between the blade and the ridge.

10. The MEMS electrochemical sensor of claim 9, further comprising a sensing electrode, a counter electrode, and a reference electrode, wherein each of the sensing electrode, the counter electrode, and the reference electrode is positioned within a pocket.

11. The MEMS electrochemical sensor of claim 10, further comprising a diagnostic electrode positioned in a pocket.

12. The MEMS electrochemical sensor of claim 9, further comprising a sensing electrode and a counter electrode, wherein the sensing electrode, the counter electrode, and the blade each include a zig zag shape, wherein the zig zag shape is configured to lower impedance between the sensing electrode and the counter electrode.

* * * * *